(12) United States Patent
Wang

(10) Patent No.: US 8,574,951 B1
(45) Date of Patent: Nov. 5, 2013

(54) PROCESS OF MANUFACTURING AN INTERDIGITATED BACK-CONTACT SOLAR CELL

(71) Applicant: National Tsing Hua University, Hsinchu (TW)

(72) Inventor: Li-karn Wang, Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/771,776

(22) Filed: Feb. 20, 2013

(51) Int. Cl.
*H01L 21/00* (2006.01)

(52) U.S. Cl.
USPC ............. 438/98; 438/71; 438/87; 136/256; 257/E31.032; 257/E31.124

(58) Field of Classification Search
USPC ................. 438/71, 87, 98; 136/256
See application file for complete search history.

(56) References Cited

U.S. PATENT DOCUMENTS

| | | | |
|---|---|---|---|
| 2011/0303280 A1* | 12/2011 | Pawlak et al. | 136/256 |
| 2012/0288980 A1* | 11/2012 | Moon et al. | 438/72 |
| 2013/0000715 A1* | 1/2013 | Moslehi et al. | 136/256 |
| 2013/0025677 A1* | 1/2013 | Miura et al. | 136/256 |
| 2013/0141833 A1* | 6/2013 | Moslehi et al. | 361/234 |
| 2013/0228218 A1* | 9/2013 | Lee et al. | 136/256 |

* cited by examiner

*Primary Examiner* — Alexander Ghyka
(74) *Attorney, Agent, or Firm* — Jackson IPG PLLC

(57) ABSTRACT

A process of manufacturing the interdigitated back-contact solar cell, with the use of screen printing or spraying and the use of chemical etching, forms the trenches for the P-type electrode on the back of the substrate for making the solar cell. The time-consuming process of photolithography (for example, at least two steps of high-temperature diffusion) can be avoided. Furthermore, only one machine for printing and etching is needed to form the structure of the interdigitated back-contact solar cell. The present invention can make the whole process time-efficient and low-cost to enhance the efficiency of the solar cell, fulfilling the demand of mass production.

13 Claims, 4 Drawing Sheets

PROCESS OF MANUFACTURING AN INTERDIGITATED BACK-CONTACT SOLAR CELL

BACKGROUND OF THE INVENTION

1. Field of the Invention

The present invention relates to a process of manufacturing an interdigitated back-contact solar cell and the device manufactured thereby. Particularly, it relates to a process of manufacturing an interdigitated back-contact solar cell, in which a semiconductor material is used as a substrate to form an electrode with P-N junction on the back of the substrate by means of printing or spraying and chemical etching without any time-consuming photolithographic processes.

2. Description of Related Art

Traditionally, an interdigitated back-contact solar cell is based on crystalline silicon as a substrate material. A positive electrode and a negative electrode and a PN junction are formed on the back of a device in a manner that the P and N electrodes are interdigitated and a shallow front surface field (FSF) layer is formed on the front of the device so as to reduce the lateral resistance and enhance the rate of carrier collection.

Common interdigitated back-contact solar cells use N-type semiconductor material as substrates. The surface of the substrate is etched by a chemical etching solution to form a pyramid microstructure for the majority of solar light to enter the substrate. FIG. 2A partially shows a P-type metal electrode 15 and an N-type metal electrode 17 on a back surface of an interdigitated back-contact solar cell. In a large-area interdigitated back-contact solar cell, the back electrode consists of the fork-shaped P-type and N-type metal electrodes. The light receiving side of the N-type semiconductor substrate is disposed to form a micro-structure 10. FIG. 2B shows a cross-sectional structure of FIG. 2A cut along a broken line AB. In FIG. 2B, a $N^+$ semiconductor layer 12 is grown on the light receiving side of a N-type semiconductor substrate 11 to form the front surface field for attracting those electrons close to the front of the N-type semiconductor substrate 11 and the P-type semiconductor layer 14. Those electrons then flow to the region of a back surface field, i.e. the $N^{++}$ semiconductor layer 13. The advantage of the front surface field is to reduce the recombination of electrons and holes, and thus to enhance the fill factor and the photocurrent.

In addition, to reduce the recombination of electron-hole pairs, one important way is to increase emitter area on the back of the substrate, i.e. to increase the width of the P-type semiconductor layer 14 so as to improve the rate of collecting holes at the P-type metal electrode 15 and therefore to improve transport of electrons to the $N^{++}$ semiconductor layer 13.

Conventionally, the above $N^+$ semiconductor layer and the $N^{++}$ semiconductor layer are individually subject to phosphorus doping. Alternatively, on the light receiving side of the semiconductor substrate 11 is first formed a buffer layer which is then subject to one-step phosphorus doping to produce a lightly doped layer on the light receiving side and a heavily doped layer, i.e. the $N^{++}$ semiconductor layer 13, on the back. Subsequently, one photolithographic process is used to form a separated P-type semiconductor layer 14 which is positioned apart from the $N^{++}$ semiconductor layer 13 in a staggered manner. FIG. 2C is a schematic view of an interleaved distribution of the P-type semiconductor layer 14 and the $N^{++}$ semiconductor layer 13 according to the conventional invention. Thicker lines, respectively, correspond to the locations of wide area of P-type semiconductor layer 14 and the $N^{++}$ semiconductor layer 13.

The antireflection layer 16 on the light receiving side of the semiconductor substrate 11 is used to reduce the energy reflected from the semiconductor substrate 11 and thus to generate more power. After the P-type semiconductor layer 14 and an $N^{++}$ semiconductor layer 13 have been formed on the back of the semiconductor substrate 11, the oxide layer 18 is grown on the back of the substrate to repair defects on back surface of the substrate. Finally, the oxide layer is subject to a photolithographic process to form a trench in the oxide layer so as to partially expose the P-type semiconductor layer 14 and the $N^{++}$ semiconductor layer 13 to form, respectively, the P-type metal electrode 15 and the N-type metal electrode 17 in the exposed areas. The P-type metal electrode 15 and the N-type metal electrode 17 are then subject to sintering for them to be in good contact with the back surface of the substrate. In the whole manufacturing process, the high-temperature diffusion process is performed at least twice, and multiple photolithographic processes are performed. The conventional process results in not only an increase in time and cost, but also a decrease in production rate, thus being unable to fulfill the demand of mass production. Therefore the method cannot be applied to the actual need for use.

In addition, U.S. Patent No. US20110070681 discloses the use of wet etching. However, the wet etching is used to process the surface micro-structure, rather than produce the trenches for the electrode. Its trenches are formed by laser and therefore is different from the present technique. U.S. Pat. No. 4,478,879 discloses the use of screen printing. However, the screen printing is not used to form trenches of electrodes, but instead used for doping and is therefore different from the present technique. Japanese Patent No. JP2012004565 discloses the screen printing and wet etching processes. However, the wet etching is used for processing surface microstructure, rather than to produce the trenches of electrodes. The screen printing is used to coat an etch paste for selectively etching a dielectric layer, rather than to form trenches of electrodes.

For this reason, the inventors has studied the related technology for many years based on the experiences of related manufacturing practice. After long-term research and efforts in development, the inventors has at last successfully developed this invention 'a process of manufacturing an interdigitated back-contact solar cell', which overcomes the shortages in the prior art.

SUMMARY OF THE INVENTION

A main purpose of the present invention is to provide a process of manufacturing an interdigitated back-contact solar cell, which overcomes the problems of the prior art, and uses screen printing or spraying, and the chemical etching to form trenches on the back side of the substrate, achieving a low-cost and time-efficient manufacturing process while increasing the conversion efficiency of solar cells in mass production.

Another purpose of the present invention is to provide a process of forming a structure of an interdigitated back-contact solar cell, which needs only a machine for printing and etching without any time-consuming photolithographic processes (such as two steps of high-temperature diffusion).

In order to achieve the above objectives, the process of manufacturing an interdigitated back-contact solar cell according to the present invention contains at least the following steps:

(A) providing a semiconductor substrate having a microstructure surface, forming a heavily doped $N^{++}$ semiconductor layer simultaneously on a front side and a back side of the semiconductor substrate, wherein a chemical-resistant mask is coated on the back side of the semiconductor substrate by screen printing or spraying to form a first mask layer; the semiconductor substrate is placed into a chemical etching solution to remove a certain thickness of the layer on a front side of the semiconductor layer so that the heavily doped $N^{++}$ semiconductor layer on the front side of the semiconductor substrate becomes a lightly doped first N-type semiconductor layer; and the first mask layer is removed afterwards;

(B) performing a screen printing or spraying process to form a second mask layer on the front side of the semiconductor substrate to cover the first N-type semiconductor layer, and to form a patterned third mask layer on the back side of the semiconductor substrate, so that the $N^{++}$ semiconductor layer on the back side of the semiconductor substrate is partially exposed while the unexposed part of the N++ semiconductor layer is protected by the third mask layer;

(C) etching the interior of the semiconductor substrate by using a chemical etching solution to form a plurality of trenches in the exposed part of the $N^{++}$ semiconductor layer, and the unexposed part of the $N^{++}$ semiconductor layer protected by the third mask layer is less susceptible to etching, or is completely un-etched, maintaining the function of back surface field, wherein the unexposed part of the $N^{++}$ semiconductor layer protected by the third mask layer forms a second N-type semiconductor layer, meanwhile the first N-type semiconductor layer on the front side of the semiconductor substrate is protected by the second mask layer, maintaining the function of front surface field;

(D) removing the second and third mask layers, and then coating an anti-reflection layer on the front side of the semiconductor substrate; and (E) forming a P-type metal electrode and an N-type metal electrode by printing, respectively, in the trench and at a part of the area of the second N-type semiconductor layer, and then forming a P-type semiconductor layer at a part of the bottom or at the whole bottom of each trench through co-firing so that the P-type metal electrode and the N-type metal electrode both form good electrical contact with the semiconductor substrate in the fabrication of the interdigitated back-contact solar cell.

In one embodiment of the present invention, the semiconductor substrate at least contains one element selected from silicon or germanium, and is an N-type semiconductor substrate; the second N-type semiconductor layer has a higher electrical doping concentration than the first N-type semiconductor layer, and both N-type semiconductor layers have, respectively, a higher electrical doping concentration than the semiconductor substrate.

In one embodiment of the present invention, the semiconductor substrate at least contains one element selected from silicon or germanium, and is a P-type semiconductor substrate; the second N-type semiconductor layer has a higher electrical doping concentration than the first N-type semiconductor layer, and the P-type semiconductor layer has a higher electrical doping concentration than the P-type semiconductor substrate.

In one embodiment of the present invention, the semiconductor substrate is monocrystalline or multicrystalline.

In one embodiment of the present invention, the P-type metal electrode on the back side of the semiconductor substrate is further subject to sintering to form a P-type semiconductor layer.

In one embodiment of the present invention, the semiconductor substrate has a thickness between 6~700 μm.

In one embodiment of the present invention, the trenches on the back side of the semiconductor substrate have a depth less than 350 μm.

In one embodiment of the present invention, a part of the second N-type semiconductor layer on the back side of the semiconductor substrate is positioned in a manner to interleave with a part of the P-type semiconductor layer.

In one embodiment of the present invention, the P-type semiconductor layer is distributed in a plurality of regions of the back side of the semiconductor substrate in a disconnected manner.

In one embodiment of the present invention, the second N-type semiconductor layer is distributed in a plurality of regions of the back side of the semiconductor substrate in a disconnected manner.

In one embodiment of the present invention, the front side of the semiconductor substrate has a passivation layer of silicon oxide, silicon nitride, silicon carbide or amorphous silicon film.

In one embodiment of the present invention, the anti-reflection layer is made of silicon oxide or silicon nitride.

In one embodiment of the present invention, the back side of the semiconductor substrate has a passivation layer of silicon oxide, silicon nitride, silicon carbide or amorphous silicon film.

DETAILED DESCRIPTION OF THE PREFERRED EMBODIMENTS

The aforementioned illustrations and the following detailed descriptions are exemplary for the purpose of further explaining the scope of the present invention.

Figure 1:
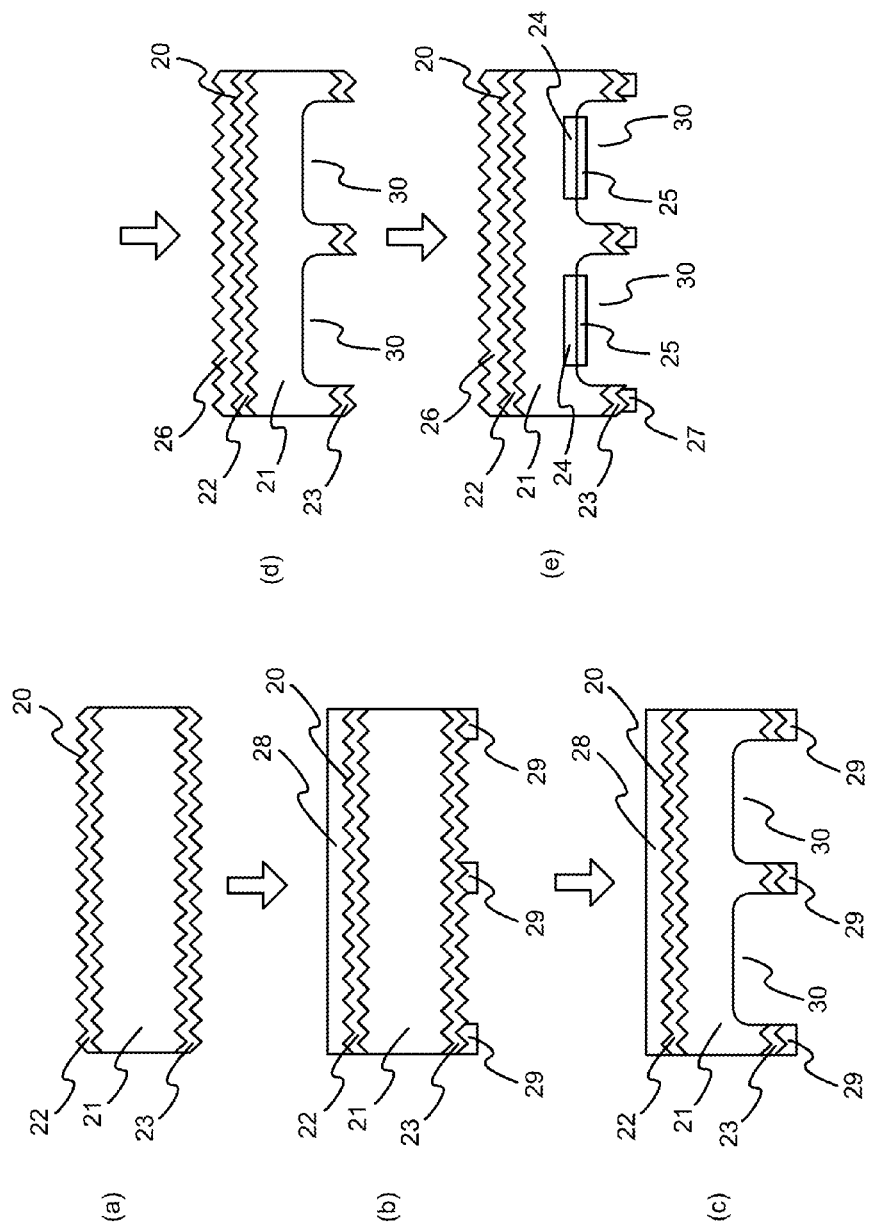
FIG. 1 is a schematic view of a process of manufacturing an interdigitated back-contact solar cell according to the present invention.
Figure 2A:
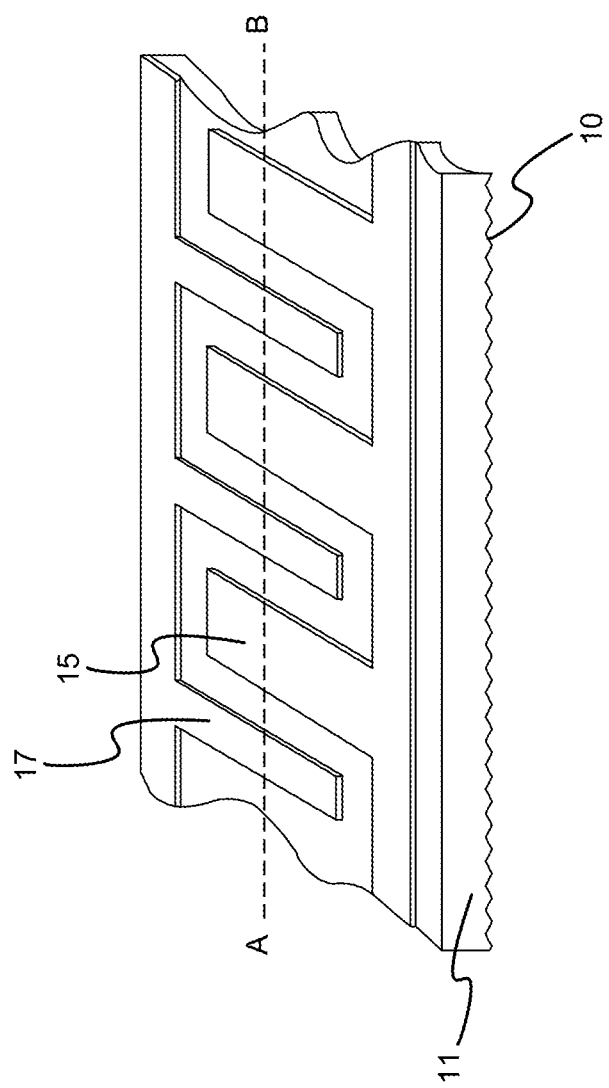
FIG. 2A is a schematic view, partially showing the distribution of P, N type metal electrodes on a back side of a conventional solar cell.
Figure 2B:
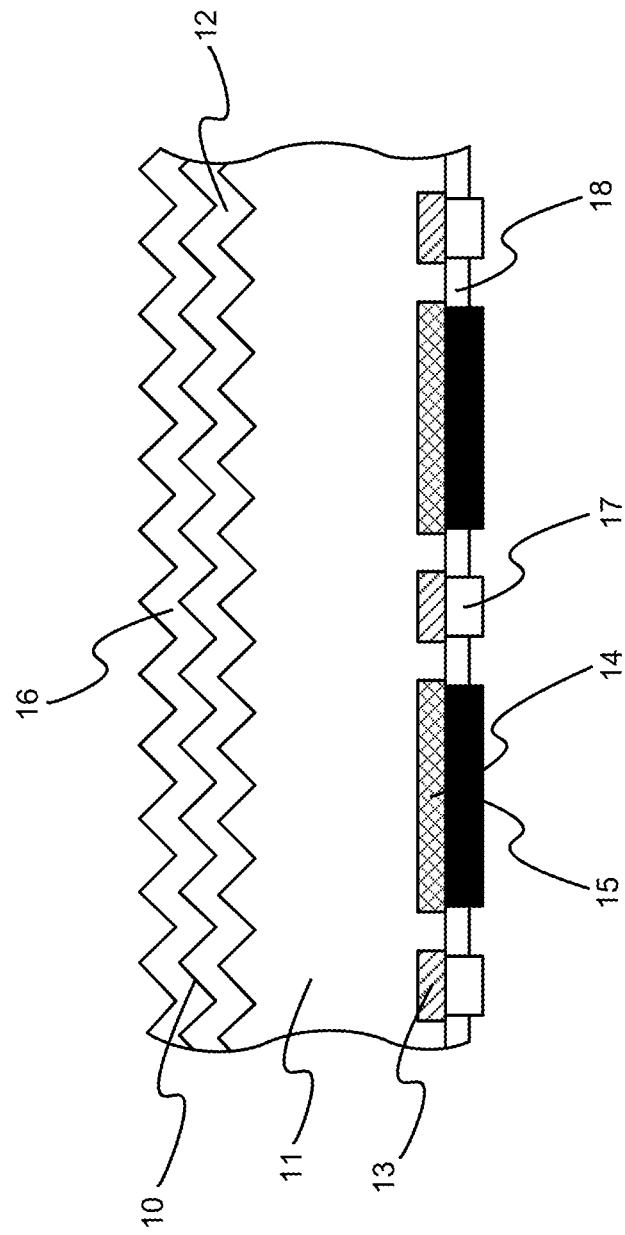
FIG. 2B is a cross-sectional view of FIG. 2A taken along a broken line AB.
Figure 2C:
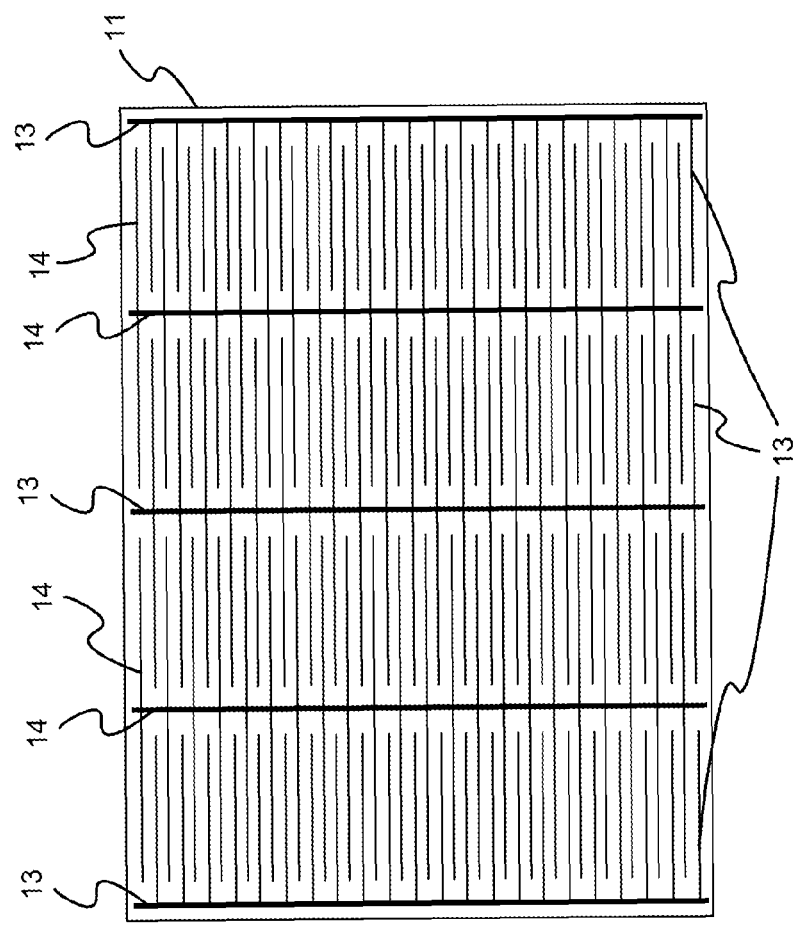
FIG. 2C is a schematic view, partially showing the distribution of P, N type metal electrodes on a back side of a conventional solar cell.

FIG. 1 is a schematic view of a process of manufacturing an interdigitated back-contact solar cell according to the present invention. As shown, the process of manufacturing an interdigitated back-contact solar cell according to the present invention, in one embodiment, uses an N-type semiconductor substrate for illustration. The semiconductor substrate, being monocrystalline or multicrystalline, at least contains one element selected from silicon or germanium, and has a thickness between 6~700 μm. FIG. 1 shows a cross-sectional view of a part of the device during the manufacturing process. It is noted that the relative ratio of each part of the structure in FIG. 1 is not consistent with the actual size.

When manufactured, the N-type semiconductor substrate 21 after cleaning is etched to form a micro-structure 20, for example, a pyramid-shaped structure, to capture the lights so as to facilitate the sunlight to be introduced into the substrate. Generally in the manufacturing process, a front surface and a rear surface of the N-type semiconductor substrate 21 both have a micro-structure. Then an $N^+$ semiconductor layer 22 is formed under the micro-structure surface 20 on the front surface of the N-type semiconductor substrate 21. An $N^{++}$ semiconductor layer 23 is formed on the rear surface of the N-type semiconductor substrate 21. The $N^+$ semiconductor layer 22 and the $N^{++}$ semiconductor layer 23 have, respectively, an electrical doping concentration higher than the N-type semiconductor substrate 21. Its side-view structure is as shown in FIG. 1(a). A front mask layer 28 is formed on the front surface of the N-type semiconductor substrate 21 by screen printing or spraying. A patterned rear mask layer 29 is formed on the rear surface of the N-type semiconductor substrate 21. Thereby, a part of the $N^{++}$ semiconductor layer 23 is exposed while another part of the $N^{++}$ semiconductor layer 23 is protected by the rear mask layer 29. At this moment, the side-view structure of the N-type semiconductor substrate 21 is as shown in FIG. 1(b). Then the N-type semiconductor substrate 21 is dipped in a chemical etching solution to form a trench 30 in the exposed region of the $N^{++}$ semiconductor layer 23. The $N^{++}$ semiconductor layer 23 protected by the rear mask layer 29 is less susceptible to etching or completely un-etched, and maintains the function of back surface field. Meanwhile, the $N^+$ semiconductor layer 22 on the front surface of the N-type semiconductor substrate 21, is protected by the front mask layer 28 and maintains the function of front surface field. At this moment, the side-view structure of the N-type semiconductor substrate 21 is as shown in FIG. 1 (c). The depth formed by etching the trench 30 is less than 350 µm. After the mask layers 28,29 are removed, a film at least containing silicon oxide, silicon nitride, silicon carbide or amorphous silicon is grown on the back of the N-type semiconductor substrate 21 as a passivation layer to repair any defects on the surface of the silicon substrate, enhancing the lifetime of the carrier. At this moment, a film of silicon oxide, silicon nitride, silicon carbide or amorphous silicon can be grown on the front surface of the N-type semiconductor substrate 21 as a passivation layer. However, in one embodiment, no silicon oxide, silicon nitride, silicon carbide or amorphous silicon is grown on the back of the N-type semiconductor substrate 21. Thereafter, a film at least containing silicon oxide or silicon nitride is coated on the front surface of the N-type semiconductor substrate 21 as an antireflection layer 26, so that more sunlight enters into the N-type semiconductor substrate 21 and is converted into electrical energy in order to enhance efficiency. FIG. 1(d) shows a side-view structure of the N-type semiconductor substrate 21 with an antireflection layer 26 which is coated after the removal of the mask layers 28 and 29. Even though the aforementioned silicon oxide, silicon nitride, silicon carbide, or amorphous silicon films are not shown, these films may exist as described previously. Then, a P-type metal electrode 25 and an N-type metal electrode 27 are formed by printing, respectively, in the trench 30 and at a part of the area of the $N^{++}$ semiconductor layer 23. The material for the N-type metal electrode 27 at least contains gold, silver, copper, zinc, nickel, titanium, or palladium. The material for the P-type metal electrode 25 at least contains aluminum. The P-type metal electrode 25 partially or totally covers the bottom of the trench 30. After the metal electrodes are produced, an emitter region, i.e. a P-type semiconductor layer 24, is formed on a part of the bottom or at the whole bottom of the trench 30 through co-firing, so that the P-type metal electrode 25 and the N-type metal electrodes 27 can be in good electrical contact with the N-type semiconductor substrate 21. In one embodiment, the metal electrodes can be sintered sequentially, i.e., the P-type metal electrode 25 is first printed and sintered, and then the N-type metal electrode 27 is printed and sintered. Alternatively, the N-type metal electrode 27 is first printed and sintered, and then the P-type metal electrode 25 is first printed and sintered. The side-view structure after sintering is shown in FIG. 1(e). The interdigitated back-contact solar cell according to the present invention is thereby completed.

As such, the above process constitutes a novel process of manufacturing an interdigitated back-contact solar cell.

In the process of manufacturing an interdigitated back-contact solar cell according to another embodiment of the present invention, the semiconductor substrate may contain at least one element of silicon or germanium, and can be a P-type semiconductor substrate with electrical properties of P-type doping. The electrical doping concentration of the $N^{++}$ semiconductor layer is higher than that of the $N^+$ semiconductor layer. The electrical doping concentration of the P-type semiconductor layer is higher than that of the P-type semiconductor substrate.

In the present invention, a lightly doped $N^+$ semiconductor layer 22 and a heavily doped $N^{++}$ semiconductor layer 23 are formed, respectively, on the front and the back of the N-type semiconductor substrate 21. In a preferred embodiment, the heavily doped $N^{++}$ semiconductor layers are first formed on both front and back of the semiconductor substrate by one-step phosphorus doping. Then by means of screen printing or spraying, a chemical-resistant mask layer is formed to covers the back of the substrate. Then the semiconductor substrate is dipped in the chemical etching solution to remove a certain thickness of the front layer of the semiconductor substrate so that the heavily doped $N^{++}$ semiconductor layer on the front of the semiconductor substrate becomes lightly doped $N^+$ semiconductor layer. After the mask layer is removed, the structure as shown in FIG. 1(a) is formed.

By means of screen printing or spraying in the present invention, a chemical-resistant mask layer and a patterned mask layer are formed to cover, respectively, the front and back of the N-type semiconductor substrate 21, so that the uncovered $N^{++}$ semiconductor layer 23 and the corresponding semiconductor substrate can be removed through the etching solution. The subsequently formed $N^{++}$ semiconductor layer 23 and the P-type semiconductor layer 24 are positioned in an interdigitated manner. The entire process does not need any time-consuming photolithographic processes, which makes the invention very practical.

In the present invention, the P-type semiconductor layer 24 is formed at the bottom region of the trench 30 by sintering an aluminum-containing electrode, eliminating the trouble of contact connection between the P-type metal electrode 25 and the N-type metal electrode 27. Therefore, there is no need for another process required by the prior art, such as using a laser to separate the two electrically-different metal electrodes. In addition, the trench 30 formed by etching allows the back of the N-type semiconductor substrate 21 to produce significant visual contrast, which helps to accurately position the P-type metal electrode 25 and the N-type metal electrode 27, preventing the occurrence of overlapping. Therefore, the process of manufacturing the interdigitated back-contact solar cell and the device manufactured thereby according to the present invention, with the use of screen printing or spraying and the use of chemical etching, form the trench for the P-type electrode on the back of the substrate for making the interdigitated back-contact solar cell. The time-consuming process of photolithography (for example, at least two steps of high-temperature diffusion) can be avoided. Furthermore, only one machine for printing, etching and masking is needed to form the interdigitated back-contact solar cell. The present invention can thus make the whole process low-cost and time-efficient so as to enhance the efficiency of the solar cell, achieving the purpose of mass production.

In summary, the present invention relates to a process of manufacturing an interdigitated back-contact solar cell and the device manufactured thereby. The present invention can effectively avoid the shortcomings of the prior art by means of printing or spraying chemical-resistant masks as well as chemical etching to form the P and N type semiconductor layers on a back of the substrate as well as front surface field in a one-step diffusion process, making the whole cell fabrication process simple and low-cost, in fulfilling the demand of mass production of the solar cell. This makes the present invention more progressive and more practical in use and comply with the patent law.

The descriptions illustrated above simply represent the preferred embodiments of the present invention; however, the characteristics of the present invention are by no means restricted thereto. Any changes or modifications conveniently considered by those skilled in the art are deemed to be encompassed within the scope of the present invention delineated by the following claims.

What is claimed is:

1. A process of manufacturing an interdigitated back-contact solar cell, comprising at least the following steps:

(F) providing a semiconductor substrate having a microstructure surface, forming a heavily doped $N^{++}$ semiconductor layer on a front side and a back side of said semiconductor substrate, wherein a chemical-resistant mask layer is coated on the back side of said semiconductor substrate by screen printing or spraying to form a first mask layer; said semiconductor substrate is placed into a chemical etching solution to remove a certain thickness of said heavily doped $N^{++}$ semiconductor layer on a front side of said semiconductor substrate so that the heavily doped $N^{++}$ semiconductor layer on the front side of said semiconductor substrate becomes a lightly doped first N-type semiconductor layer; and said first mask layer is removed;

(G) performing a screen printing or spraying process to form, respectively, a second mask layer on the front side of said semiconductor substrate to cover said first N-type semiconductor layer, and to form a patterned third mask layer on the back side of said semiconductor substrate, so that the $N^{++}$ semiconductor layer on the back side of said semiconductor substrate is partially exposed while the unexposed part of the N++ semiconductor layer is protected by said third mask layer;

(H) etching the interior of the semiconductor substrate by using a chemical etching solution to form a plurality of trenches in the exposed part of the $N^{++}$ semiconductor layer, and the unexposed part of the $N^{++}$ semiconductor layer protected by said third mask layer is less susceptible to etching, or is completely un-etched, maintaining the function of back surface field, wherein the unexposed part of the $N^{++}$ semiconductor layer protected by said third mask layer forms a second N-type semiconductor layer, meanwhile said first N-type semiconductor layer on the front side of said semiconductor substrate is protected by said second mask layer, maintaining the function of front surface field;

(I) removing said second and third mask layers, and then coating an antireflection layer on the front side of said semiconductor substrate; and (J) forming a P-type metal electrode and an N-type metal electrode by printing, respectively, in the trench and at a part of the area of said second N-type semiconductor layer, and then forming a P-type semiconductor layer at a part of the bottom or at the whole bottom of each trench through co-firing so that said P-type metal electrode and said N-type metal electrode both form good electrical contact with said semiconductor substrate in the fabrication of the interdigitated back-contact solar cell.

2. The process of claim 1, wherein said semiconductor substrate at least contains one element selected from silicon or germanium, and is an N-type semiconductor substrate; said second N-type semiconductor layer has a higher electrical doping concentration than said first N-type semiconductor layer; said first and second N-type semiconductor layers have a higher electrical doping concentration than the semiconductor substrate.

3. The process of claim 1, wherein said semiconductor substrate comprises at least contains one element selected from silicon or germanium, and is a P-type semiconductor substrate; said second N-type semiconductor layer has a higher electrical doping concentration than said first N-type semiconductor layer, and said P-type semiconductor layer has a higher electrical doping concentration than said P-type semiconductor substrate.

4. The process of claim 1, wherein said semiconductor substrate is monocrystalline or multicrystalline.

5. The process of claim 1, wherein said P-type metal electrode on the back side of said semiconductor substrate is further subject to sintering to form a P-type semiconductor layer.

6. The process of claim 1, wherein said semiconductor substrate has a thickness between 6~700 μm.

7. The process of claim 1, said trenches on the back side of said semiconductor substrate respectively have a depth less than 350 μm.

8. The process of claim 1, wherein a part of said second N-type semiconductor layer on the back side of said semiconductor substrate is positioned in a manner so as to interleave with a part of said P-type semiconductor layer.

9. The process of claim 1, wherein said P-type semiconductor layer is distributed in a plurality of regions of the back side of said semiconductor substrate in a disconnected manner.

10. The process of claim 1, wherein said second N-type semiconductor layer is distributed in a plurality of regions of the back side of said semiconductor substrate in a disconnected manner.

11. The process of claim 1, wherein the front side of said semiconductor substrate has a passivation layer of silicon oxide, silicon nitride, silicon carbide or amorphous silicon film.

12. The process of claim 1, wherein said antireflection layer is made of silicon oxide or silicon nitride.

13. The process of claim 1, wherein the back side of said semiconductor substrate has a passivation layer of silicon oxide, silicon nitride, silicon carbide or amorphous silicon film.

* * * * *